(12) United States Patent
Chang et al.

(10) Patent No.: US 9,281,821 B2
(45) Date of Patent: *Mar. 8, 2016

(54) TIME DIVISION MULTIPLEXED LIMITED SWITCH DYNAMIC LOGIC

(71) Applicant: INTERNATIONAL BUSINESS MACHINES CORPORATION, Armonk, NY (US)

(72) Inventors: Leland Chang, New York, NY (US); Robert K. Montoye, Rochester, MN (US); Yutaka Nakamura, Kyoto-Fu (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/665,942

(22) Filed: Mar. 23, 2015

(65) Prior Publication Data

US 2015/0222267 A1    Aug. 6, 2015

Related U.S. Application Data

(63) Continuation of application No. 14/062,431, filed on Oct. 24, 2013, now Pat. No. 9,030,235, which is a continuation of application No. 13/524,562, filed on Jun. 15, 2012, now Pat. No. 8,604,832, which is a continuation of application No. 13/494,607, filed on Jun. 12, 2012, now Pat. No. 8,493,093.

(51) Int. Cl.
*H03K 19/096* (2006.01)

(52) U.S. Cl.
CPC .......... *H03K 19/0963* (2013.01); *H03K 19/096* (2013.01)

(58) Field of Classification Search
None
See application file for complete search history.

(56) References Cited

U.S. PATENT DOCUMENTS

| | | | | |
|---|---|---|---|---|
| 5,378,942 A * | 1/1995 | Wu | ............. | H03K 19/0963 326/21 |
| 6,441,648 B1 * | 8/2002 | Hsu | ............. | H03K 19/0963 326/95 |
| 6,690,204 B1 * | 2/2004 | Belluomini | ........ | H03K 19/0963 326/112 |
| 6,891,399 B2 | 5/2005 | Ngo et al. | | |
| 7,202,705 B2 | 4/2007 | Ngo et al. | | |
| 7,372,305 B1 | 5/2008 | Ngo et al. | | |
| 7,414,436 B1 * | 8/2008 | Klim | ............. | H03K 19/0963 326/121 |
| 7,598,774 B2 | 10/2009 | Belluomini et al. | | |

(Continued)

OTHER PUBLICATIONS

Belluomini, W., et al. "Limited Switch Dynamic Logic Circuits for High-Speed Low-Power Circuit Design" IBM Journal of Research and Development, vol. 50, No. 2-3. Mar. 2006. pp. 277-286.

(Continued)

*Primary Examiner* — Alexander H Taningco
*Assistant Examiner* — Nelson Correa
(74) *Attorney, Agent, or Firm* — Tutunjian & Bitetto, P.C.; Vazken Alexanian (57) ABSTRACT

A method for enabling double pumping in a limited switch dynamic logic circuit includes precharging a dynamic node in accordance with a first clock signal and a second clock signal. The dynamic node is evaluated to a first value in response to one or more first input signals of a first evaluation tree in accordance with the first clock signal. The dynamic node is evaluated to a second value in response to one or more second input signals of a second evaluation tree in accordance with the second clock signal.

10 Claims, 7 Drawing Sheets

(56) References Cited

U.S. PATENT DOCUMENTS

| | | | |
|---|---|---|---|
| 7,934,057 B1 | 4/2011 | Raza | |
| 7,977,977 B1 * | 7/2011 | Natarajan | H03K 19/0963 326/95 |
| 7,990,180 B2 * | 8/2011 | Lundberg | H03K 19/01728 326/93 |
| 8,493,093 B1 * | 7/2013 | Chang | H03K 19/0963 326/93 |
| 8,542,033 B2 * | 9/2013 | Lee | H03K 19/0966 326/93 |
| 8,604,832 B1 * | 12/2013 | Chang | H03K 19/0963 326/93 |
| 8,928,354 B2 * | 1/2015 | Kim | 326/98 |

OTHER PUBLICATIONS

Chang, J. "Variability and Voltage Supply Scaling in Limited Switch Dynamic Logic" University of California, Berkeley, EE241, May 2006, downloaded from bwrc.eecs.berkeley.edu. pp. 1-4.

Fetzer, E., et al. "A Fully-Bypassed 6-Issue Integer Datapath and Register File on an Itanium Microprocessor" 2002 IEEE International Solid-State Circuits Conference (ISSCC 2002), Session 25. Feb. 2002. (3 Pages).

Sivagnaname, J., et al. "Controlled-Load Limited Switch Dynamic Logic Circuit" Proceedings of the Sixth International Symposium on Quality Electronic Design (ISQED '05). Mar. 2005. (5 Pages).

* cited by examiner

```
┌─────────────────────────────────────────┐
│ Precharging a first dynamic node during a│
│ precharge phase of a first evaluation clock signal│
│                    602                   │
└─────────────────────────────────────────┘
                    ↓
┌─────────────────────────────────────────┐
│ Evaluating the first dynamic node in response to one or│
│ more first input signals of a first evaluation tree during│
│ an evaluation phase of the first evaluation clock signal│
│                    604                   │
└─────────────────────────────────────────┘
                    ↓
┌─────────────────────────────────────────┐
│ Precharging a second dynamic node during a│
│ precharge phase of a second evaluation clock signal│
│                    606                   │
└─────────────────────────────────────────┘
                    ↓
┌─────────────────────────────────────────┐
│ Evaluating the second dynamic node in response to one or│
│ more second input signals of a second evaluation tree during│
│ an evaluation phase of the second evaluation clock signal│
│                    608                   │
└─────────────────────────────────────────┘
                    ↓
┌─────────────────────────────────────────┐
│ Outputting a signal of the LSDL circuit in response to at least│
│ one of the first dynamic node during the evaluation phase of│
│ the first evaluation clock signal and the second dynamic node│
│ during the evaluation phase of the second evaluation│
│                clock signal              │
│                    610                   │
└─────────────────────────────────────────┘
```

Precharging a dynamic node during a precharge phase of a
first evaluation clock signal and a
second evaluation clock signal
702

Evaluating the dynamic node in response to one or
more first input signals of a first evaluation tree during
the evaluation phase of the first evaluation clock signal
704

Evaluating the dynamic node in response to one or more
second input signals of a second evaluation tree during
the evaluation phase of the second evaluation clock signal
706

Outputting a signal of the LSDL circuit in response to the
dynamic node according to an output latch clock signal
708

FIG. 7

TIME DIVISION MULTIPLEXED LIMITED SWITCH DYNAMIC LOGIC

RELATED APPLICATION INFORMATION

This application is a Continuation application of co-pending U.S. patent application Ser. No. 14/062,431, filed on Oct. 24, 2013, which is itself a Continuation of issued U.S. Pat. No. 8,604,832, filed on Jun. 15, 2012, which in turn is a Continuation of issued U.S. Pat. No. 8,493,093, filed Jun. 12, 2012, both of which are incorporated herein by reference in their entirety.

BACKGROUND

1. Technical Field

The present invention relates to limited switch dynamic logic circuits, and more particularly to high-speed time division multiplexed limited switch dynamic logic circuits to enable high-speed double pumping.

2. Description of the Related Art

Whether by frequency scaling or parallelism, as microprocessor performance increases, the demand for high-speed memory grows dramatically. To sustain system performance trends, increasing memory capacity requirements is critical. However, memory capacity is generally a tradeoff with memory performance. Double pumping may be able to satisfy these tradeoff requirements, particularly with a multi-port register file (RF) or content addressable memory (CAM). Double pumping transfers data on both the rising and falling edge of the clock signal. By using both edges of the clock, the data signals operate with the same limiting frequency, thereby doubling the data transmission rate. In order to apply double pumping, a high-speed time division multiplexing circuit is needed.

SUMMARY

A method for enabling double pumping in a limited switch dynamic logic circuit includes precharging a dynamic node in accordance with a first clock signal and a second clock signal. The dynamic node is evaluated to a first value in response to one or more first input signals of a first evaluation tree in accordance with the first clock signal. The dynamic node is evaluated to a second value in response to one or more second input signals of a second evaluation tree in accordance with the second clock signal.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, time division multiplexed (TDM) limited switch dynamic logic (LSDL) circuits and methods are provided. LSDL circuits are a combination of dynamic logic circuits and static logic circuits.

In one embodiment, an LSDL circuit in NAND form is configured to enable double pumping by performing logic evaluation operations in both halves of a processor clock cycle. An LSDL circuit in NAND form may include first and second evaluation clock signals. Initially, the first and second evaluation clock signals are simultaneously low, causing a first precharge device to precharge a first dynamic node to a logic high value and a second precharge device to precharge a second dynamic node to a logic high value. During a first evaluation phase, e.g., in a first half of a clock cycle, the first evaluation clock signal pulses high, causing a first evaluation tree to evaluate the first dynamic node to a logic high or logic low value according to one or more first input signals of the first evaluation tree. A static latch provides an output of the LSDL circuit in NAND form in response to the value of the first dynamic node during an evaluation phase of the first evaluation clock. The first evaluation clock signal then returns low to a precharge phase. During a second evaluation phase, e.g., in a second half of a clock cycle, the second evaluation clock signal pulses high, causing a second evaluation tree to evaluate the second dynamic node to a logic high or logic low value according to one or more second input signals of the second evaluation tree. The static latch provides an output of the LSDL circuit in NAND form in response to the value of the second dynamic node during an evaluation phase of the second evaluation clock. The second clock signal then returns low to a precharge phase. Advantageously, the present principles provide an LSDL device in NAND form to enable high-speed double pumping such that logic evaluation operations are performed in each half of a clock cycle to increase performance.

In another embodiment, an LSDL circuit may include a first evaluation clock signal, a second evaluation clock signal, and an output latch clock signal. Preferably, the output latch clock signal is generated by the logical OR of the first evaluation clock signal and the second evaluation clock signal. Initially, the first and second evaluation clock signals and the output latch clock signal are simultaneously low, causing a precharge device to precharge the dynamic node to a logic high value. During a first evaluation phase, e.g., in a first half of a clock cycle, the first evaluation clock signal and the output latch clock signal pulse high, causing a first evaluation tree to evaluate the dynamic node to a logic high or logic low value according to one or more first input signals. A static latch provides an output of the LSDL circuit in response to the value on the dynamic node according to the output latch clock signal. The first clock signal and the output latch clock signal then return low to a precharge phase. During a second evaluation phase, e.g., in a second half of a clock cycle, the second clock and the output latch clock signal pulse high, causing a second evaluation tree to evaluate the dynamic node to a logic high or logic low value according to one or more second input signals. The static latch provides an output of the LSDL circuit in response to the value on the dynamic node according to the output latch clock signal. The second evaluation clock signal and the output latch clock signal then return low to a precharge phase. Advantageously, the present principles provide an LSDL device with a simplified circuit architecture that enables double pumping. The reduced number of devices will lead to an increase in performance. In addition, by implementing double-pumping in an LSDL device, logic evaluation operations are performed in each half of a clock cycle to further increase performance.

Aspects of the present invention are described below with reference to flowchart illustrations and/or block diagrams of methods and apparatus (systems) according to embodiments of the invention. The flowchart and block diagrams in the Figures illustrate the architecture, functionality, and operation of possible implementations of systems and methods according to various embodiments of the present invention. It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of given illustrative circuit architectures; however, other architectures, structures, substrate materials and process features and steps may be varied within the scope of the present invention. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
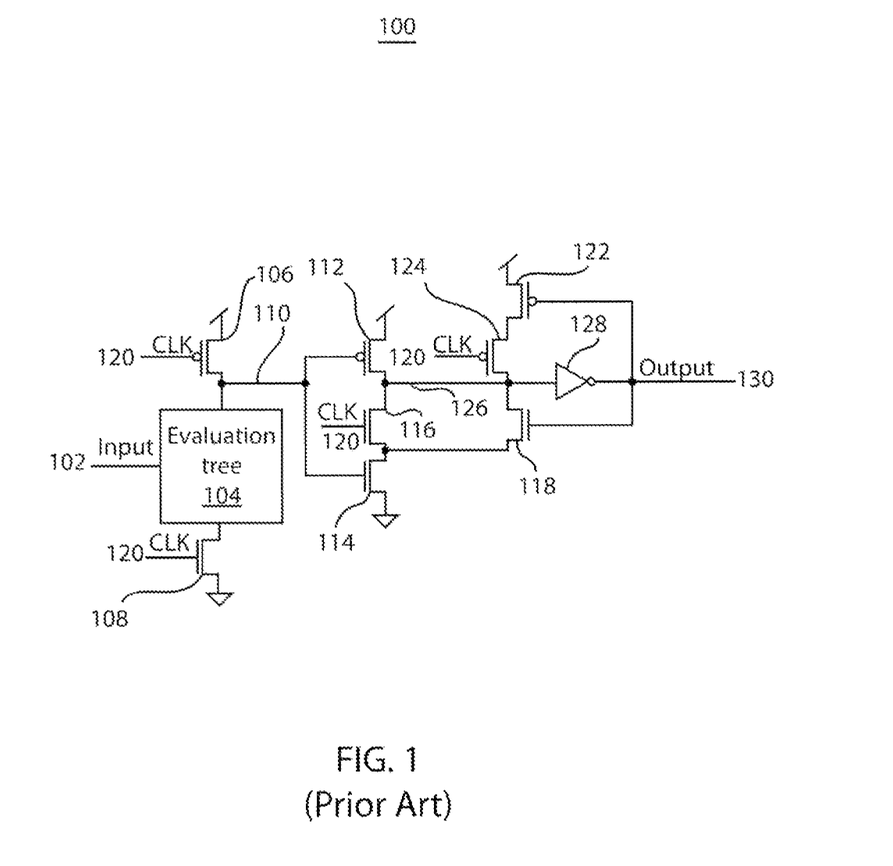
FIG. 1 shows a block/flow diagram, in partial schematic form, of a prior art LSDL device combining a dynamic circuit front end with a simple latch.

Referring now to the drawings in which like numerals represent the same or similar elements and initially to FIG. 1, a block/flow diagram, in partial schematic form, illustratively depicts a prior art limited switch dynamic logic (LSDL) device 100. LSDL is a combination of static logic circuits and dynamic logic circuits.

LSDL device 100 receives a plurality, n, of inputs 102 provided to evaluation tree 104. Evaluation tree 104 performs Boolean computations on inputs 102 to provide an output on the dynamic node 110 (during an evaluation phase). Evaluation tree 104 is coupled between the drain of precharge device p-channel field effect transistor (PFET) 106 and the drain of foot device n-channel field effect transistor (NFET) 108. The junction of the evaluation tree 104 and the drain of PFET 106 form the dynamic node 110. PFET 106 and NFET 108 are clocked by clock signal 120. When clock signal 120 is low (i.e., the precharge phase), PFET 106 is turned on to precharge dynamic node 110 to a logic high value. When clock signal 120 is high (i.e., the evaluation phase), PFET 106 is turned off and NFET 108 is turned on, allowing dynamic node 110 to be selectively discharged to ground according to the Boolean combination of inputs 102 from evaluation tree 104.

Dynamic node 110 is coupled to the common junction of the gates of pre-driver devices PFET 112 and NFET 114. PFET 112 and NFET 114 form an inverter pair to invert the signal on the dynamic node 110 and provide gain. PFET 112 and NFET 114 are serially coupled to parallel NFETs 116 and 118. Header device NFET 116 is clocked by clock signal 120. Feedback devices NFET 118 and PFET 122 receive feedback from the output 130 of LSDL device 100 and are used to restore charge to the latched value. NFET 118 and PFET 122 allow the value in the latch to be held as long as the clock is kept low (i.e., precharge phase). A latch is formed by inverter pair PFET 112 and NFET 114 and feedback devices NFET 118 and PFET 122. LSDL device 100 may include cut feedback device PFET 124, which is clocked by clock signal 120. PFET 124 cuts the feedback through PFET 122 during the evaluation phase to prevent conflict between feedback devices PFET 122 and NFET 114 when node 126 switches from logic high to logic low. The signal at node 126 drives the output 130 by output driver inverter 128.

Figure 2:
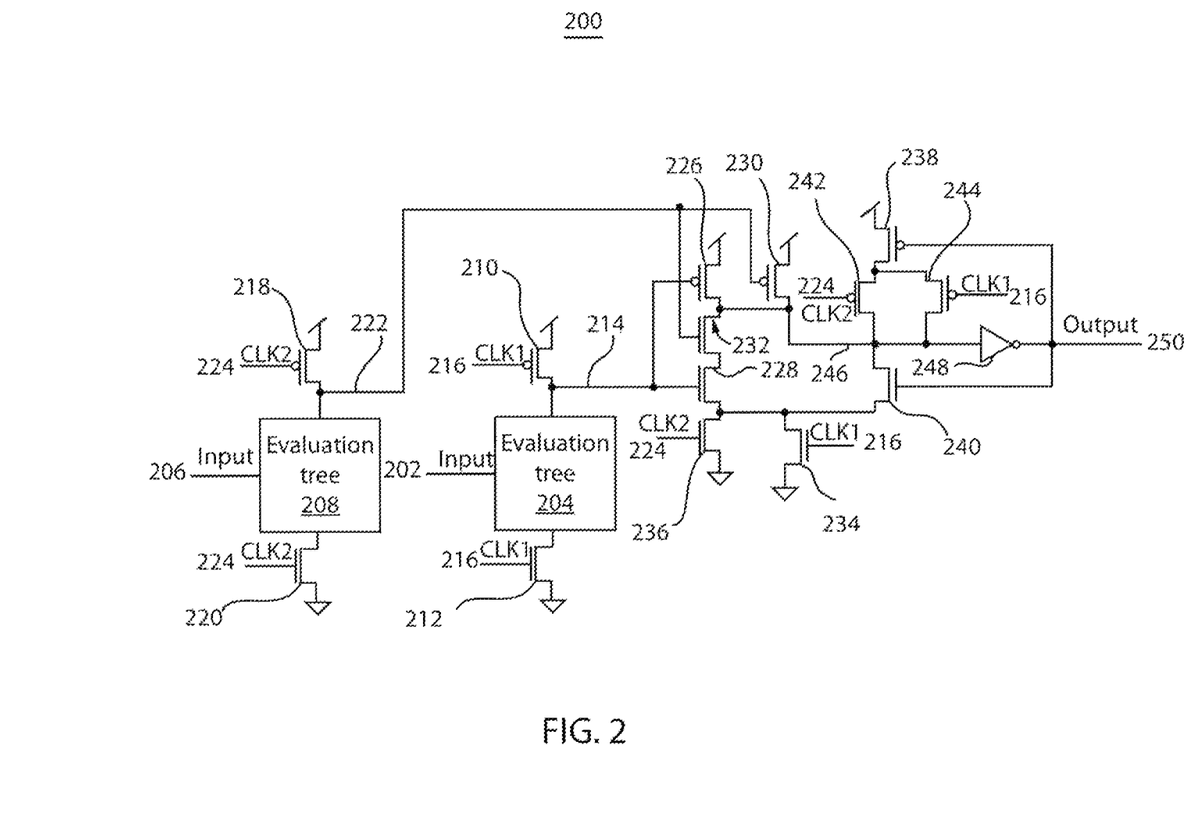
FIG. 2 shows a block/flow diagram, in partial schematic form, of an LSDL device in NAND form including two evaluation trees tied to two separate clocks to enable double pumping, in accordance with one illustrative embodiment.

Referring now to FIG. 2, a block/flow diagram, in partial schematic form, illustratively depicts a time division multiplexed LSDL device in NAND form 200 to enable double pumping, in accordance with one embodiment. NAND form LSDL device 200 receives a plurality, n, of logical inputs 202 provided to evaluation tree 204 (e.g., NFET evaluation tree). Evaluation tree 204 performs Boolean logic computations on inputs 202 to provide a logical output on a first dynamic node 214 during an evaluation phase. NAND form LSDL device 200 also receives a plurality, m, of inputs 206 into evaluation tree 208 (e.g., NFET evaluation tree). The number of inputs 202 and 206 do not necessarily have to be equal. Evaluation tree 208 performs Boolean computations on inputs 206 to provide an output on a second dynamic node 222 during an evaluation phase.

Evaluation tree 204 is coupled between the drain of precharge device PFET 210 and the drain of foot device NFET 212. The junction of the evaluation tree 204 and PFET 210 forms the first dynamic node 214. PFET 210 and NFET 212 are clocked with a (e.g., early phase) first evaluation clock signal 216. When the first evaluation clock signal 216 is low, during the precharge phase, PFET 210 is turned on to charge dynamic node 214 to a logic high value and NFET 212 is turned off to prevent the static latch circuit from burning dynamic power. During the precharge phase, NFET 212 prevents dynamic node 214 from being evaluated by evaluation tree 204, regardless of input 202. When the first evaluation clock signal 216 is high, during the evaluation phase, PFET 210 is turned off and NFET 212 is turned on, allowing dynamic node 214 to be selectively discharged to ground according to the Boolean combination of inputs 202 from evaluation tree 204. In one embodiment, PFET 210 may be sized to be the smallest device capable of precharging the dynamic node 214 within the allocated precharge time.

Evaluation tree 208 is coupled between the drain of precharge device PFET 218 and the drain of foot device NFET 220. The junction of the evaluation tree 208 and PFET 218 forms a second dynamic node 222. PFET 218 and NFET 220 are clocked with a (e.g., late phase) second evaluation clock signal 224. Advantageously, by utilizing two clocks, performance may be doubled. When the second evaluation clock signal 224 is low, during the precharge phase, PFET 218 is turned on to charge dynamic node 222 to a logic high value and NFET 220 is turned off to prevent the static latch circuit from burning dynamic power. During the precharge phase, NFET 218 prevents dynamic node 222 from being evaluated by evaluation tree 208, regardless of inputs 206. When the second evaluation clock signal 224 is high, during the evaluation phase, PFET 218 is turned off and NFET 220 is turned on, allowing dynamic node 222 to be selectively discharged to ground according to the Boolean combination of inputs 206 from evaluation tree 208. In one embodiment, PFET 218 may be sized to be the smallest device capable of precharging the dynamic node 222 within the allocated precharge time.

Figure 3:
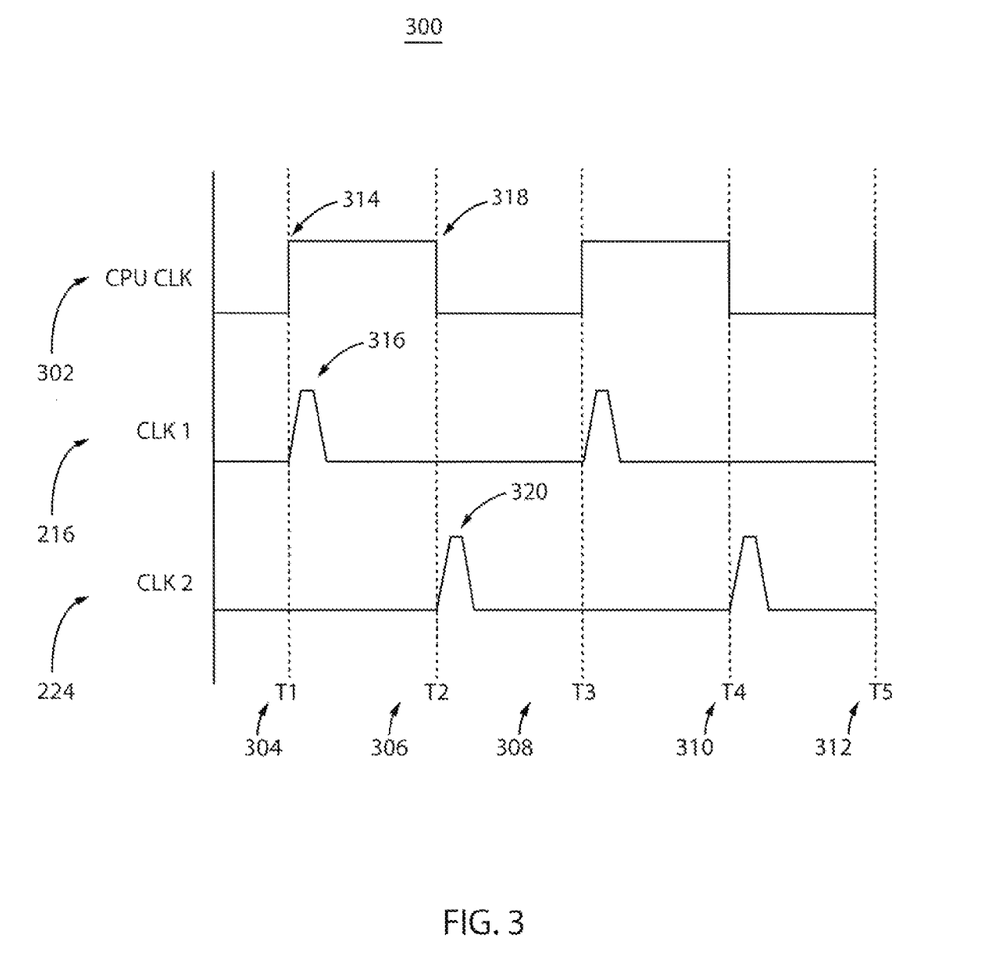
FIG. 3 shows a timing diagram for first and second clocks for an LSDL device in NAND form in a double pumping implementation, in accordance with one illustrative embodiment.

In a preferred embodiment, first and second evaluation clock signals 216 and 224 are configured in a double-pumping implementation; however, it is noted that the present principles are much broader, as other configurations of clock signals 216 and 224 are also contemplated. Referring for a moment to FIG. 3, with continued reference to FIG. 2, a timing diagram 300 is illustratively depicted for the first evaluation clock signal 216, the second evaluation clock signal 224 and a central processing unit (CPU) clock 302 configured in a double-pumping implementation, in accordance with one embodiment. Initially, just prior to time T1 304, first and second evaluation clock signals 216 and 224 are simultaneously low (i.e., precharge phase), allowing precharge devices 210 and 218 to precharge dynamic nodes 214 and 222, respectively. In a first half of a cycle of CPU clock 302, such as between times T1 304 and T2 306 (e.g., at rising edge 314), the first evaluation clock signal 216 pulses high 316, allowing evaluation tree 204 to evaluate dynamic node 214 according to inputs 202. An output 250 of LSDL device in NAND form 200 is determined in response to dynamic node 214 and the first evaluation clock signal 216 then returns low to a precharge phase. In a second half of a cycle of CPU clock 302, such as between times T2 306 and T3 308 (e.g., at the falling edge 318), the second evaluation clock signal 224 pulses high 320, allowing evaluation tree 208 to evaluate dynamic node 222 according to inputs 206. The output 250 is determined in response to dynamic node 222 and then clock signal 224 returns low to a precharge phase. This process continues over times T3 308, T4 310, T5 312, etc. Advantageously, by implementing a double-pumping configuration, a logic evaluation operation is performed in each half of a cycle of CPU clock 302.

Referring back to FIG. 2, first dynamic node 214 is coupled to the common junction of the gates of pre-driver devices PFET 226 and NFET 228. Second dynamic node 222 is coupled to the common junction of the gates of pre-driver devices PFET 230 and NFET 232. Pre-driver devices PFETs 226 and 230 and NFETs 228 and 232 form a NAND gate. When dynamic nodes 214 and 222 are high, NFETs 228 and 232 will conduct, PFETs 226 and 230 will not conduct, resulting in a conductive path between output node 246 and ground, bringing the output node 246 low. When either of dynamic nodes 214 and 222 are low, one of NFETs 228 and 232 will not conduct, one of PFETs 226 and 230 will conduct, resulting in a conductive path between output node 246 and the voltage source, bringing the output node 246 high. It is noted that while PFETs 226 and 230 and NFETs 228 and 232 perform a logical NAND function, other logical functions are contemplated within the scope of the present invention.

In one embodiment, parallel foot devices NFETs 234 and 236 are serially coupled to the NAND gate. NFETS 234 and 236 prevent the forward propagation of the signal on dynamic nodes 214 and 222 during the precharge phase. In one embodiment, where evaluation trees 204 and 208 are guaranteed to be off when the dynamic front end is in the precharge phase, foot devices 212 and 220 are not necessary. NFET 234 is clocked by the first evaluation clock signal 216 and prevents the forward propagation of the signal on dynamic node 214 during the precharge phase of clock signal 216. NFET 236 is clocked by the second evaluation clock signal 224 and prevents the forward propagation of the signal on dynamic node 222 during the precharge phase of clock signal 224.

Feedback devices PFET 238 and NFET 240 receive feedback from the output 250 of the LSDL device in NAND form 200 to restore the charge to the latched value. PFET 238 and NFET 240 allow the value in the latch to be held as long as the clocks 216 and 224 are kept low (i.e., during precharge phase). A latch is formed by PFET 238 and NFET 240. In one embodiment, LSDL device in NAND form 200 may include cut feedback devices, PFETs 242 and 244, which are clocked by the second and first evaluation clock signals 224 and 216, respectively. PFETs 242 and 244 cut the feedback through PFET 238 during the evaluation phase to prevent conflict between PFET 238 and NFETs 234 and 236 when node 246 switches from logic high to logic low. PFETs 242 and 244 increase loading on their respective clock signals, which leads to an increase in clock power consumption, but provides increased speed and circuit robustness. The signal at node 246 drives the output 250 by the output driver inverter 248 to mitigate noise propagation from dynamic nodes 214 and 222.

Advantageously, the time division multiplexed LSDL device in NAND form 200 is configured to implement double-pumping. As such, a logic evaluation operation is performed in each half of a clock cycle. By utilizing two clock signals (clock signals 216 and 224), performance may be doubled.

Figure 4:
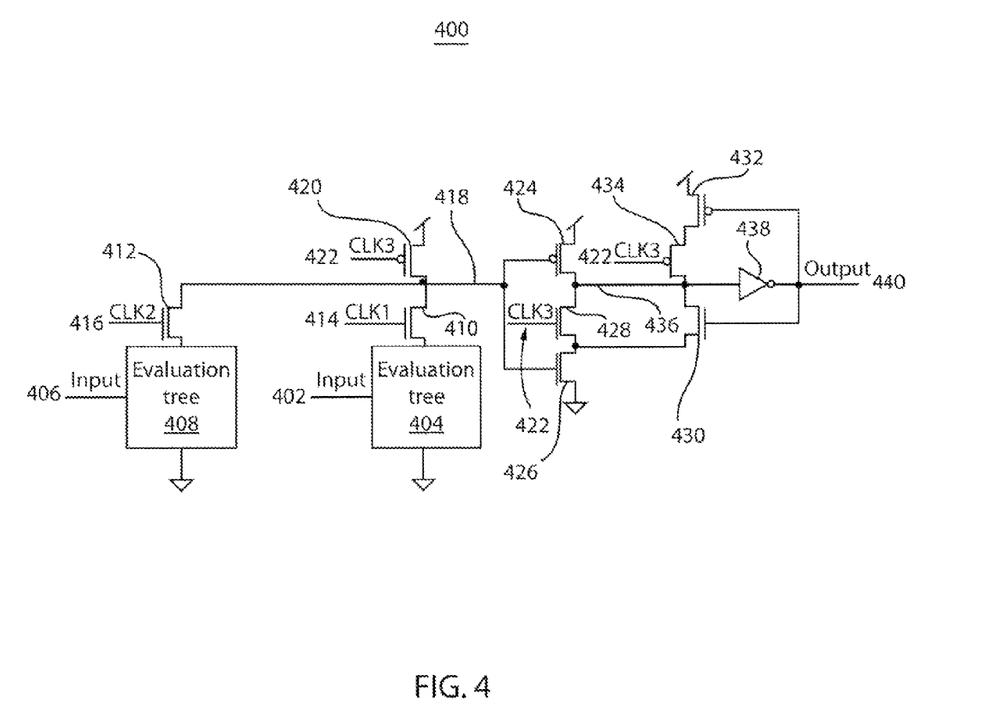
FIG. 4 shows a block/flow diagram, in partial schematic form, of an LSDL device to enable double pumping with a simplified circuit architecture achieved by implementing a third clock signal, in accordance with one illustrative embodiment.

Referring now to FIG. 4, a block/flow diagram, in partial schematic form, illustratively depicts an LSDL device 400 to enable double pumping with a simplified circuit architecture, in accordance with one embodiment. LSDL device 400 receives a plurality, n, of logical inputs 402 provided to NFET evaluation tree 404. Evaluation tree 404 performs Boolean logic computations on inputs 402 to provide a logical output to the source of foot device NFET 410. NFET 410 is clocked by a first evaluation clock signal 414 and limits dynamic node diffusion capacitance to evaluation tree 404 during a precharge phase of the clock signal 414. LSDL device 400 also receives a plurality, m, of inputs 406 provided to NFET evaluation tree 408. Inputs n and m do not necessarily have to be equal. Evaluation tree 408 performs Boolean computations on inputs 406 to provide an output to the source of foot device NFET 412. NFET 412 is switched with a second evaluation clock signal 416 and limits dynamic node diffusion capacitance to evaluation tree 408 during a precharge phase of the clock signal 416.

During the precharge phase, if at least one of inputs 402 and 406 are high, then the latched data might flip and the dynamic node 418 may be pulled down halfway. Thus, NFETs 410 and 412 are turned off during the precharge phase to prevent dynamic node 418 from being evaluated by evaluation trees 404 and 408, regardless of inputs 402 and 406. The junction of the drains of NFETs 410 and 412 form the dynamic node 418. By moving foot devices NFETs 410 and 412 above evaluation trees 404 and 408, diffusion capacitance from dynamic node 418 to evaluation trees 404 and 408 is reduced, thereby increasing performance. In addition, since clocked NFETS 410 and 412 are located above the evaluation trees, they are located closer to the output 440 of the LSDL device 400 (compared with NFETS 212 and 220 of LSDL device in NAND form 200 of FIG. 2) to further increase performance.

Dynamic node 418 is coupled to the drain of precharge device PFET 420. PFET 420 is clocked with an output latch clock signal 422. In a particularly useful embodiment, output latch clock signal 422 may be created by a logical OR of first and second evaluation clock signals 414 and 416. Other derivations of output latch clock signal 422 have also been contemplated within the scope of the present principles. In a preferred embodiment, first and second evaluation clocks 414 and 416 are non-overlapping clock signals. When either of first or second evaluation clock signals 414 or 416 are low, during the precharge phase, PFET 420 is turned on to precharge dynamic node 418 to a logic high value. When first evaluation clock signal 414 is high, during the evaluation phase, PFET 420 is turned off and NFET 410 is turned on, allowing dynamic node 418 to be selectively discharged to ground according to the Boolean combination of inputs 402 from evaluation tree 404. When second evaluation clock signal 416 is high, during the evaluation phase, PFET 420 is turned off and NFET 412 is turned on, allowing dynamic node 418 to be selectively discharged to ground according to the Boolean combination of inputs 406 from evaluation tree 408. In yet another embodiment, PFET 420 is sized to be the smallest device capable of precharging the dynamic node 418 within the allocated precharge time.

Figure 5:
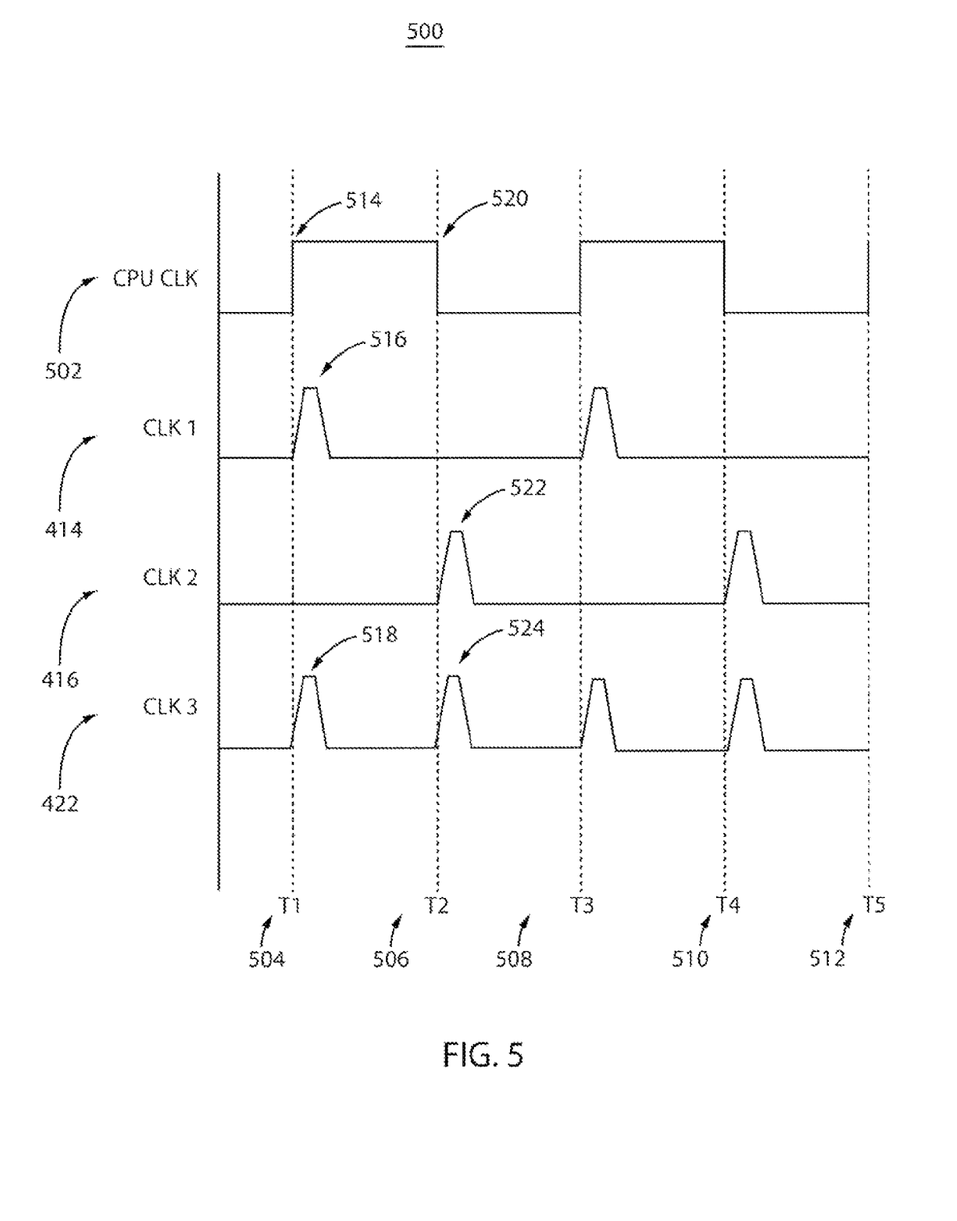
FIG. 5 shows a timing diagram for first, second and third clocks for an LSDL device in a double pumping implementation with a simplified circuit architecture, in accordance with one illustrative embodiment.

In a preferred embodiment, first evaluation clock signal 414, second evaluation clock signal 416 and output latch clock signal 422 are configured in a double pumping implementation; however, it is noted that the present principles are much broader, as other configurations of clock signals 414, 416 and 422 are also contemplated. Referring for a moment to FIG. 5, and with continued reference to FIG. 4, a timing diagram 500 is illustratively depicted for first evaluation clock signal 414, second evaluation clock signal 416 and output latch clock signal 422 and CPU clock 502, in accordance with one embodiment. It can be seen that output latch clock signal 422 is the logical OR of first evaluation clock signal 414 and second evaluation clock signal 416. Initially, just prior to time T1 504, clock signals 414, 416 and 422 are simultaneously low (i.e., precharge phase), allowing precharge device 420 to precharge dynamic node 418. In a first half of a cycle of CPU clock 502, such as between times T1 504 and T2 506 (e.g., at rising edge 514), first evaluation clock signal 414 pulses high 516 and output latch clock signal 422 pulses high 518 simultaneously, allowing evaluation tree 404 to evaluate dynamic node 418 according to inputs 402. An output 440 of LSDL device 400 is determined in response to dynamic node 418 and clock signals 414 and 422 then return low to a precharge phase. In a second half of a cycle of CPU clock 502, such as between times T2 506 and T3 508 (e.g., at the falling edge 520), second evaluation clock signal 416 pulses high 522 and output latch clock signal 422 pulses high 524 simultaneously, allowing evaluation tree 408 to evaluate dynamic node 418 according to inputs 406. The output 440 is determined in response to dynamic node 418 and clock signals 416 and 422 then return low to a precharge phase. This process continues over times T3 508, T4 510, T5 512, etc. Advantageously, by implementing a double-pumping configuration, a logic evaluation operation is performed in each half of a cycle of CPU clock 302. It can be seen that clock 422 pulses high twice in a single cycle.

Referring back to FIG. 4, dynamic node 418 is coupled to the common junction of the gates of pre-driver devices PFET 424 and NFET 426. PFET 424 and NFET 426 form an inverter pair to invert the signal on the dynamic node 418 and provide gain to strengthen the signal. PFET 424 and NFET 426 prevent back-propagation of the signal on node 436 to the dynamic node 418. PFET 424 and NFET 426 are serially coupled to parallel NFETs 428 and 430. Header device NFET 428 is switched by output latch clock signal 422 and prevents the forward propagation of the signal on dynamic node 418 onto the latch during the precharge phase.

Feedback devices NFET 430 and PFET 432 receive feedback from the output 440 of the LSDL device 400 to restore the charge to the latched value. A latch is formed by inverter pair PFET 424 and NFET 426 and feedback devices NFET 430 and PFET 432. PFET 432 and NFET 430 allow the value in the latch to be held as long as the clock signal 422 is kept low. In one embodiment, LSDL device 400 may include cut feedback device PFET 434, which is clocked by output latch clock signal 422. PFET 434 cuts the feedback through PFET 432 during the evaluation phase to prevent conflict between PFET 432 and NFET 426 when node 436 switches from logic high to logic low. PFET 434 increases loading on the clock, leading to an increase in clock power consumption, but providing increased speed and circuit robustness. The signal at node 436 drives the output 440 by output driver inverter 438 to mitigate noise propagation from dynamic node 418.

Advantageously, time division multiplexed LSDL device 400 enables high-speed double-pumping with a simplified circuit architecture by generating a third clock signal (i.e., output latch clock signal 422). First, the three high stacked NFET stack (NFETs 228, 232 and 236 in FIG. 2) of LSDL device in NAND form 200 is returned to a two high stack (NFETs 426 and 428 in FIG. 4), which is similar to that of LSDL device 100 of FIG. 1. Assuming all devices are sized to be the same, LSDL device 400 will drive more current, thereby increasing performance. Second, duplicated devices, such as pre-charge devices (PFETs 210 and 218), foot devices (NFETs 212 and 220), PFET pre-driver devices (PFETs 226 and 230) and cut feedback devices (PFETs 242 and 244) in LSDL device in NAND form 200 of FIG. 2 are returned to a single device in LSDL device 400 of FIG. 4 by providing an output latch clock signal 422. The reduction in the number of devices will lead to a further increase in performance. Third, foot devices (NFETs 212 and 220) in LSDL device in NAND form 200 of FIG. 2 are moved above the evaluation trees (NFETs 410 and 412) in LSDL device 400 of FIG. 4. By positioning NFETs 410 and 412 above evaluation trees 404 and 408, node diffusion capacitance from the dynamic node 418 to evaluation trees 404 and 408 is reduced and clocked NFETs 410 and 412 are located closer to the output, leading to an increase in performance. Table 1 summarizes LSDL device in NAND form 200 of FIG. 2 as compared with LSDL device 400 of FIG. 4.

TABLE 1 a comparison of the NAND form LSDL device 200 of FIG. 2 with the LSDL device 400 of FIG. 4.

| | LSDL device in NAND form 200 of FIG. 2 | LSDL device 400 of FIG. 4 |
| --- | --- | --- |
| Number of NFET stacks | 3 (NFETs 228, 232 and 236) | 2 (NFETs 426 and 428) |
| Clocked NFET location | Bottom footer location | Above evaluation trees |
| Number of pull-up PFETs | 2 (PFETs 210 and 218) | 1 (PFET 420) |

In one illustrative example, the present principles may be applied to a two read/two write port register file (RF). Implementing the double pumping scheme, a two read/two write port RF can be translated into a one read/one write port RF with four sets of addresses, which needs a total of 32 (16 for read and 16 for write) time division multiplexed LSDL partial address decoders, such as, for example, LSDL device 400 of FIG. 4. The early true/complement addresses may be evaluated by a first evaluation clock signal 414 and the late true/complement addresses may be evaluated by the second evaluation clock signal 416. During a precharge phase, when first evaluation clock signal 414, second evaluation clock signal 416, and output latch clock signal 422 are low, dynamic node 418 is precharged to a logic high. During an evaluation phase, when first evaluation clock signal 414 and output latch clock signal 422 are simultaneously high, dynamic node 418 is evaluated to stay at a logic high value or go to a logic low value by evaluation tree 404. When second evaluation clock signal 416 and output latch clock signal 422 are simultaneously high, dynamic node 418 is evaluated to stay at a logic high value or go to a logic low value by evaluation tree 408. The dynamic node 418 drives pre-driver devices PFET 424 and NFET 426 and node 436 drives the output as a partially decoded line by the output driver 438. Returning back to a precharge phase, when first evaluation clock signal 414, second evaluation clock signal 416 and output latch clock signal 422 are low, data is latched by feedback devices PFET 432 and NFET 430.

Figure 6:
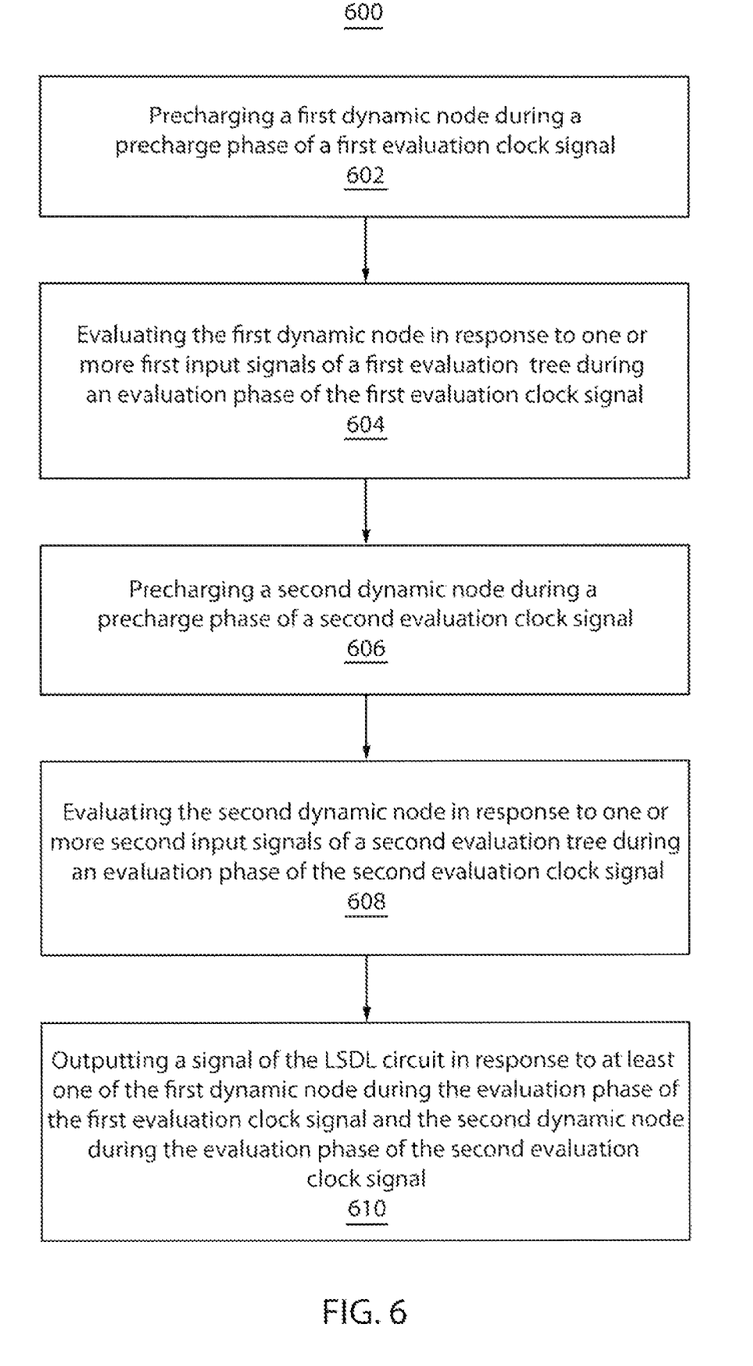
FIG. 6 shows a block/flow diagram of a system/method for enabling double pumping in an LSDL device in NAND form using two evaluation trees tied to two separate clocks, in accordance with one illustrative embodiment.

Referring now to FIG. 6, a block/flow diagram showing a system/method for enabling double pumping in an LSDL device in NAND form 600 using two evaluation trees tied to two separate clocks is illustratively depicted in accordance with one illustrative embodiment. In block 602, a first dynamic node is precharged during a precharge phase of a first evaluation clock signal. Precharging the first dynamic node may include controlling the evaluation of the first dynamic node by, for example, providing a foot device (e.g., NFET) clocked to the first evaluation clock signal and coupled between an output of a first evaluation tree and a ground. In one embodiment, the precharge phase of the first evaluation clock signal is a low signal. In block 604, the first dynamic node is evaluated in response to one or more first input signals of the first evaluation tree during an evaluation phase of the first evaluation clock signal. The first evaluation tree may receive a plurality of inputs. The first evaluation tree performs Boolean computations on the first input signals during the evaluation phase to provide an output on the first dynamic node.

In block 606, a second dynamic node is precharged during a precharge phase of a second evaluation clock signal. Precharging the second dynamic node may include controlling the evaluation of the second dynamic node by, for example, providing a foot device (e.g., NFET) clocked to a second evaluation clock signal and coupled between an output of a second evaluation tree and a ground. In yet another embodiment, the precharge phase of the second clock signal is a low signal. In block 608, the second dynamic node is evaluated in response to one or more second input signals of a second evaluation tree during an evaluation phase of the second evaluation clock signal. The second evaluation tree may also receive a plurality of inputs. The number of inputs of the first and second evaluation trees does not necessarily have to be equal. The second evaluation tree performs Boolean computations of the second inputs to provide an output on the second dynamic node.

In block 610, a signal of the LSDL circuit is outputted in response to at least one of the first dynamic node during the evaluation phase of the first evaluation clock signal and the second dynamic node during the evaluation phase of the second evaluation clock signal. In one embodiment, providing an output of the LSDL circuit includes applying a logical NAND operation in response to the first and second dynamic nodes onto a first output node. It is noted that the present principles are not limited to a logical NAND operation, but may include any logical operation. In yet another embodiment, providing an output of the LSDL circuit includes preventing forward propagation of the signal on the first and second dynamic nodes during the precharge phase of the first and second evaluation clock signals.

The output of the LSDL circuit may be fed back through first and second feedback devices to the first output node, allowing the value in the latch to be held during the precharge phase of the first and second evaluation clock signals. In still another embodiment, feeding back the output of the LSDL device may include cutting the feedback through the first feedback device during the evaluation phase of at least one of the first and second evaluation clock signals. The signal on the first output node is driven to the output of the LSDL circuit by an inverter to mitigate noise propagation from the first and second dynamic nodes. The output of the LSDL circuit may be latched during the precharge phase of the first and second evaluation clock signals.

Figure 7:
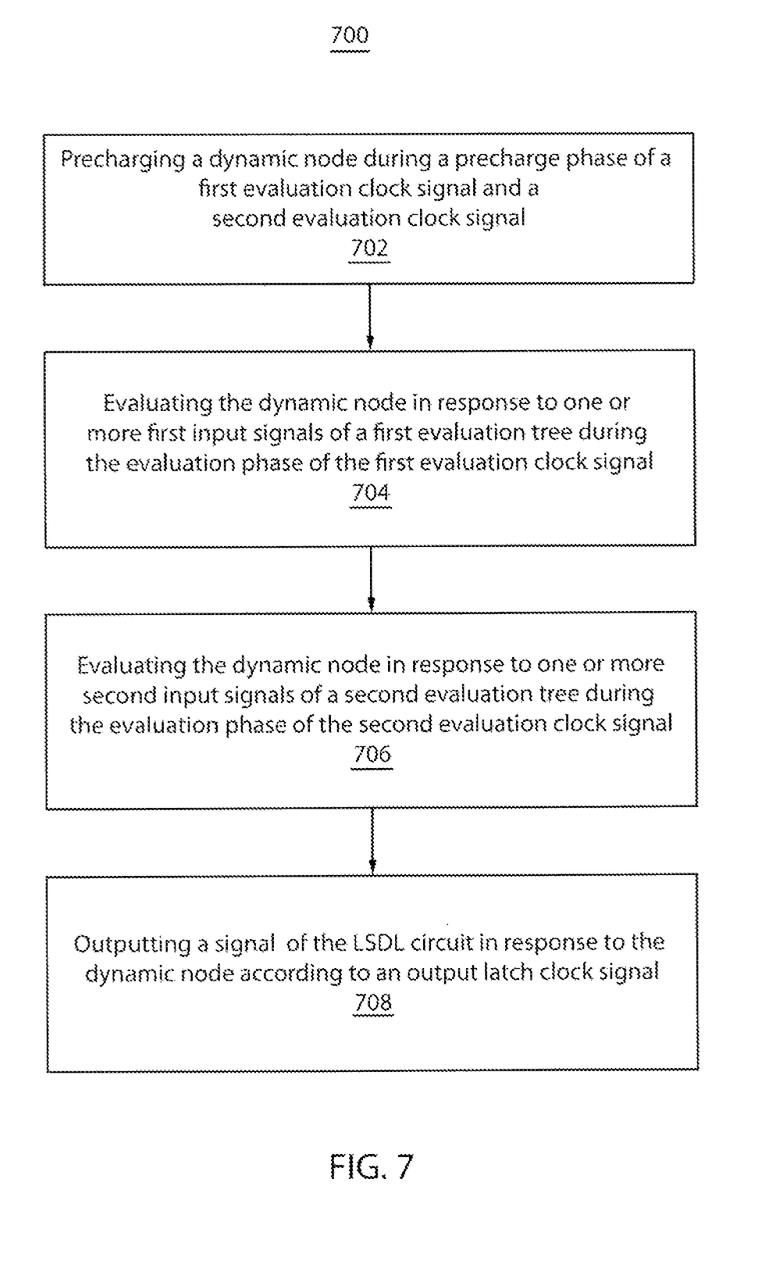
FIG. 7 shows a block/flow diagram of a system/method for enabling double pumping in an LSDL device with a simplified circuit architecture, in accordance with one illustrative embodiment.

Referring now to FIG. 7, a block/flow diagram of a system/method for enabling double pumping in an LSDL device with a simplified circuit architecture is provided in accordance with one illustrative embodiment. In block 702, a dynamic node is precharged during a precharge phase of a first evaluation clock signal and a second evaluation clock signal. Precharging the dynamic node may include controlling the evaluation of the dynamic node by, for example, providing a first foot device (e.g., NFET) clocked to a first evaluation clock signal and coupled between an output of a first evaluation tree and the dynamic node and providing a second foot device (e.g., NFET) clocked to a second evaluation clock signal and coupled between an output of a second evaluation tree and the dynamic node. Further, precharging the dynamic node may include reducing the diffusion capacitance from the dynamic node to a first and second evaluation tree. In one embodiment, the precharge phase of the first evaluation clock signal and the second evaluation clock signal is a low signal.

In block 704, the dynamic node is evaluated in response to one or more first input signals of the first evaluation tree during an evaluation phase of the first evaluation clock signal. The first evaluation tree may perform Boolean computations on a plurality of inputs to provide an output on the dynamic node during an evaluation phase of the first evaluation clock signal. In one embodiment, the evaluation phase of the first evaluation clock signal is a high signal. In block 706, the dynamic node is evaluated in response to one or more second input signals of the second evaluation tree during an evaluation phase of the second evaluation clock signal. The second evaluation tree may perform Boolean computations on a plurality of inputs to provide an output on the dynamic node during an evaluation phase of the second evaluation clock signal. In one embodiment, the evaluation phase of the second evaluation clock signal is a high signal. Preferably, the first and second evaluation clock signals are non-overlapping.

In block 708, a signal of the LSDL circuit is outputted in response to the dynamic node according to an output latch clock signal. In a particularly useful embodiment, the output latch clock signal is created by a logical OR of the first and second evaluation clock signals. Other derivations of the output latch clock signal have also been contemplated within the scope of the present principles. Outputting a signal of the LSDL circuit may include inverting the signal from the dynamic node onto a first output node. In one embodiment, outputting a signal may include preventing forward propagation of the signal on the dynamic node during the precharge phase of the first and second evaluation clock signals. The output of the LSDL circuit may be fed back through a first and second feedback device onto the first output node during the precharge phase of the first and second evaluation clock signals. In yet another embodiment, the feedback through the first feedback device may be cut during the evaluation phase of at least one of the first and second evaluation clock signals. The signal on the first output node may be driven to the output of the LSDL circuit by an inverter to mitigate noise propagation from the dynamic node. The output of the LSDL circuit may be latched during the precharge phase of the first and second evaluation clock signals.

Having described preferred embodiments of a system and method for time division multiplexed limited switch dynamic logic (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for enabling double pumping in a limited switch dynamic logic (LSDL) circuit, comprising:
   precharging a dynamic node in accordance with a first clock signal and a second clock signal;
   evaluating the dynamic node to a first value in response to one or more first input signals of a first evaluation tree in accordance with the first clock signal; and
   evaluating the dynamic node to a second value in response to one or more second input signals of a second evaluation tree in accordance with the second clock signal.

2. The method as recited in claim 1, wherein precharging includes:
   reducing diffusion capacitance from the dynamic node to the first evaluation tree during a precharge phase of the first clock signal; and
   reducing diffusion capacitance from the dynamic node to the second evaluation tree during a precharge phase of the second clock signal.

3. The method as recited in claim 1, wherein the first clock signal and the second clock signal are non-overlapping.

4. The method as recited in claim 1, wherein a precharge phase of the first and second clock signals is a low signal and an evaluation phase of the first and second clock signals is a high signal.

5. The method as recited in claim 1, wherein evaluating the dynamic node to a first value comprises performing Boolean logic computations from the first evaluation tree on a plurality of first input signals.

6. The method as recited in claim 1, wherein evaluating the dynamic node to a second value comprises performing Boolean logic computations from the second evaluation tree on a plurality of second input signals.

7. The method as recited in claim 1, wherein precharging comprises precharge the dynamic node upon receiving a logical low of the first or second clock signal, wherein evaluating the dynamic node to a first value comprises evaluating the dynamic node according to the first evaluation tree upon receiving a logical high of the first clock signal, and wherein evaluating the dynamic node to a second value comprises evaluating the dynamic node according to the second evaluation tree upon receiving a logical high of the second clock signal.

8. The method as recited in claim 1, wherein the second clock signal has a later phase than the first clock signal.

9. The method as recited in claim 8, wherein the second signal is half a clock cycle behind the first clock signal.

10. The method as recited in claim 1, wherein precharging includes preventing forward propagation of a signal on the dynamic node during a precharge phase of the first and second clock signals.

* * * * *